METHOD OF PRODUCING PRINTED CIRCUITS

Filed May 2, 1963 2 Sheets-Sheet 1

INVENTOR.
GERALD BOUCHER

BY [signature]

ATTORNEY

METHOD OF PRODUCING PRINTED CIRCUITS

Filed May 2, 1963 2 Sheets-Sheet 2

INVENTOR.
GERALD BOUCHER
BY [signature]
ATTORNEY

United States Patent Office 3,374,129

Patented Mar. 19, 1968

3,374,129

METHOD OF PRODUCING PRINTED CIRCUITS

Gerald Boucher, Hudson, N.H., assignor to Sanders Associates, Inc., Nashua, N.H., a corporation of Delaware Filed May 2, 1963, Ser. No. 277,646
7 Claims. (Cl. 156—3)

This invention relates to methods for producing printed circuits, and more particularly, multilayer printed circuits.

According to conventional practice, the manufacture of a printed circuit board starts with what is called a laminate, usually an insulating board of so-called epoxy glass, approximately 1/16 inch thick, to one or both sides of which is cemented a layer of copper foil so thin as to be incapable of self-support, usually only a few thousandths of an inch thick. The foil is then coated with a light-sensitive resist, and exposed through a film negative of the circuit to be produced. After development, the unexposed resist is removed, and the copper etched away except where it is covered by the exposed resist. After etching, the exposed resist is removed.

In planning and utilizing printed circuits, it has frequently been necessary, when using conventional techniques, to use a number of circuit boards to carry and interconnect all the circuit components to be employed. This has usually been done by employing both sides of the board, and interconnecting the desired points on opposite sides of the board by the insertion of metal eyelets.

If still another surface is required, an additional board has been used, and interconnections made by connectors and lead wires. Sometimes the boards have been pressed together, and connections have been made by drilling holes through the pressed-together boards and plating through the holes to form the interconnections. These known methods are in many cases unsatisfactory, because of the relatively high failure rate of the interconnections between layers of printed circuit boards, and the expense and inefficient use of board space, particularly where space and/or weight are critical.

In practicing my invention, I provide lands on the etched inner surface of one circuit layer which are molecularly united, as will be described hereinafter, to points on another layer. I start with a copper sheet of the order of 0.007" thick, which is coated with light-sensitive resist. A negative film mask of the desired lands is placed over the resist-coated sheet and exposed. The image is developed, the unexposed resist removed, and the sheet is partly, but not completely, etched, leaving the lowest conductor layer having the desired lands as a raised pattern on the etched side. Epoxy insulation is then applied to the etched face of the copper, and the epoxy is cleaned away, down to the level of the lands.

The piece is then immersed in a catalyst, and then in an electroless copper plating bath, which deposits a copper film over the entire surface of copper and epoxy. The piece is then electroplated with copper to form a second layer of copper over the first copper and epoxy coating. The new copper surface is then coated with light-sensitive resist, and exposed through a film negative of the circuit pattern of the second circuit layer. This second image is developed, the unexposed resist removed, and the piece is again etched through to the epoxy insulation, leaving the second layer image as a raised conductor pattern, molecularly united to the lands on the copper sheet.

If desired, a third layer of epoxy is applied to seal the top surface. The metal surface on the under side of the starting sheet is now coated with light-sensitive resist and exposed through a film mask to produce the bottom layer circuit image, the image developed, and the bottom surface etched. Circuit components may be mounted on the bottom surface, and soldered or welded to the metal, or formed as part of the circuit pattern. Inductors and capacitors may be formed as part of the circuit pattern by etching, and resistors may be formed with resistance paint or compounds on any circuit layer. In addition, microminiature circuits such as flip-flops, etc., may be applied to the top, bottom, or intermediate circuit pattern layers.

From the foregoing, it will be understood that among the objects of my invention are the following:

To provide an improved form of multilayer printed circuit which is relatively free from the defects and difficulties heretofore characteristic of such circuits;

To provide an improved technique for producing such circuits;

To provide a multilayer printed circuit in which there is provided improved and reliable contact between the various layers of circuitry at points where contacts between layers are desired;

To provide multilayer printed circuitry and techniques for producing them, which provide such circuits of greatly improved reliability and ruggedness under operating conditions and which techniques are more economical and more flexible than heretofore;

To provide a multilayer printed circuit which results in a monolithic assembly in which leads and interconnections are a single unit;

To provide a multilayer printed circuit in which the use of soldered joints or external detachable connectors between various layers is eliminated.

Still other objects and advantages of my invention will be apparent from the following specification.

The features of novelty which I believe to be characteristic of my invention are set forth with particularity in the appended claims. My invention itself, however, both as to its fundamental principles and as to its particular embodiments, will best be understood by reference to the specification and accompanying drawing, in which FIGS. 1*a*, 1*b*, 1*c*, 1*d*, 1*e*, 1*f*, and 1*g* are perspective views of a multilayer printed circuit in various stages of manufacture;

Figure 3:
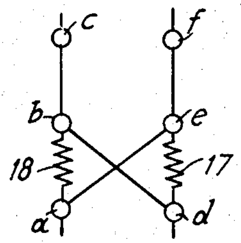
FIG. 3 is a schematic circuit diagram of the circuit of FIG. 1*g*.

It will be understood that the relatively simple circuit shown in FIG. 3 would not ordinarily require a multilayer laminate, but this simple circuit is used only for illustrative purposes, to demonstrate the principles of my invention.

In contrast to conventional practice, I start (FIG. 4, step 1) with a copper sheet somewhat thicker, preferably 0.007 inch thick, which can be handled, coated with resist, exposed and etched without being mounted on an insulating board. In case a weldable surface layer is desired in my printed circuit, I may start with a sheet of 0.0025 inch thick nickel, having one side plated with 0.0045 inch of copper. The size of the starting sheet is preferably somewhat larger than the finished dimensions, say ½ inch.

The sheet is then thoroughly cleaned (step 2) by scrubbing with "White Dot" scrubbing compound, obtainable from Etchomatic Inc., Waltham, Mass., or the equivalent, using a brass bristled brush with water, and spray rinsed thoroughly with water, and the surface dried immediately with filtered compressed air (step 3). All traces of the scrubbing compound must be removed for best results, so that the cleaned surface will hold a thin, unbroken skin of water.

The cleaned surface is then dipped or flow coated (step 4) with a photo-sensitive material which can be exposed and developed to delineate the desired circuit pattern such as Kodak Photo Resist or the equivalent. It is then allowed to dry in a vertical position for about 20 minutes (until no tackiness remains). The dried coating is light sensitive, and if the coated plates are to be stored, they should be stored in the dark.

Next, the negative film mask of the lands to be produced is aligned with the cleaned and resist-coated copper in a vacuum or pressure printing frame, and exposed (step 5) with an ultraviolet light source for about 30,000 foot candle minutes. This exposure may be varied somewhat under particular conditions for best results.

The image is then developed (step 6) by dipping in a developer suitable to develop the photosensitive material such as Kodak Photo Resist developer, or the equivalent, for two or there minutes, and flush rinsed with methyl ethyl ketone (MEK) or the equivalent, to remove the unexposed resist, and allowed to dry for about two minutes at room temperature. The image may be dyed, if desired, by dipping into Kodak Photo Resist dye or the equivalent, for about 30 seconds. Any excess dye is flushed off with water spray, and the piece dried with compressed air. The piece should then be inspected and any flaws in the exposed resist image touched up with lacquer or dope using an artist's brush.

The work is now ready for etching, which is preferabyl done in a tank containing cupric chloride etchant or the equivalent. Etching is continued to a total depth of 0.004 to 0.0045 inch, turning the piece 180° at 2 minute intervals. This will ordinarily require about 10 minutes. After etching, the piece is flushed clean with water and allowed to dry (step 7).

The exposed photoresist is then removed (step 8) by dipping the piece into a solution of Stripper 77, obtainable from Shipley Co., Wellesley, Mass., or the equivalent, for two to three minutes. It is then spray rinsed thoroughly, and dried. Care should be taken to be sure that all resist has been removed.

The surface of the workpiece is then prepared for laminating to an insulation layer made of material such as epoxy glass cloth, "Teflon" (tetrofluoroethelyne fluorocarbon resin) glass cloth, or any other suitable insulating material. Any one of several methods can be used to prepare the surface of the work piece for bonding insulation thereto. Examples of these are as follows:

The piece can be dipped in a 2 lb./gallon solution of "Ebonol," obtainable from Enthone Corp., New Haven, Conn., or the equivalent, at 95° C. (200° F.) for 10 minutes, then spray rinsed and dried (step 9). "Ebonol" is 50% sodium chlorate and 50% sodium hydroxide, and converts the copper surface to black copper oxide.

Figures 4, 5:
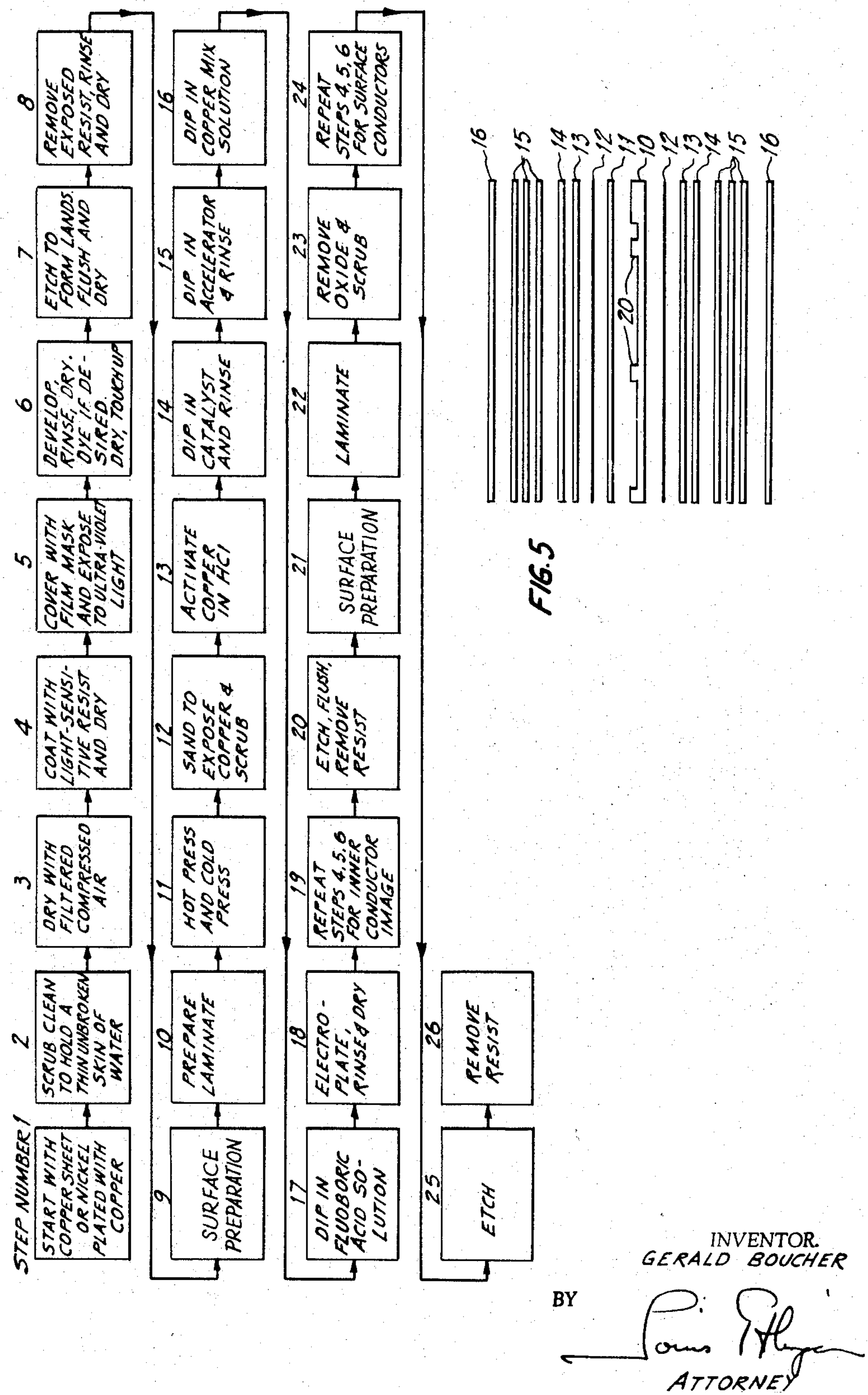
FIG. 4 is a flow diagram of the process used in fabricating a multilayer printed circuit according to my invention.
FIG. 5 is an exploded side view of a partly etched sheet assembly ready for the laminating step.

Another method is to clean the surface of the piece with an abrasive such as pumice or as described in step 2 of FIG. 4.

A third method is to lightly etch the surface with a chemical solution, cupric chloride or any other etching solution which leaves comparatively a rough surface.

Figure 1A:
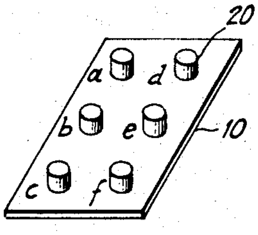

Of course the work piece must be washed and dried after each of the above set forth steps. The piece then has the appearance shown in FIG. 1*a*, the partly etched copper sheet 10 having the lands *a, b, c, d, e* and *f* projecting upwardly as a result of the etching.

The piece is now ready to be laminated (mounted with its etched side against a sheet 11 of epoxy glass). As shown in FIG. 5 I prefer to use a sheet of 112V–E730 "B" staged epoxy glass or the equivalent, and release sheets 12 of 0.001 inch "Teflon" (tetrofluoroethelyne fluorocarbon resin) are placed over and under the etched metal and epoxy sandwich. Above and below the release sheets 12, I place 1/16″ stainless steel caul plates 13, next 1/16″ "Teflon" glass pads 14, and above and under the pads 14 three pads 15 of heavy kraft paper. The top and bottom of the press assembly are formed by 1/16″ silicon glass carrier plates 16.

With the press temperature set at 325° F., the assembly is inserted and a pressure of 200 p.s.i. applied for 4 to 5 minutes, then the pressure is increased to 500 p.s.i. and held for 20 minutes to cure. The assembly is then transferred to a cold press and cooled for 10 minutes, or until it is cool enough to handle (step 11). Sheets 12–16 are then removed, leaving the etched piece 10 and the epoxy glass 11 bonded together over the etched surface.

As an alternative process to laminating the insulation layer as described above and as shown in step 11 in FIG. 4, any suitable adhesive can be used to bond the insulation layer to the etched copper conductors to any of the aforesaid type of surface treatments such as "Ebonol" solution, cleaning, lightly etching or etching and electroplating with suitable current densities.

Figure 1B:
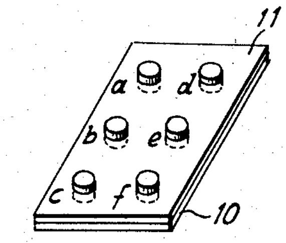

The assembly is then sanded on the etched side to remove the excess epoxy and leave the copper lands 20 exposed and clean, as shown in FIG. 1*b*. For this I prefer to use 180 grit emery cloth and sand with cross strokes (step 12). The piece is then scrubbed as described in step 2. The copper is then activated by a 30 second dip in a 25% solution of HCl (step 13).

The piece is then dipped into catalyst 6F, obtainable from Shipley Co., Wellesley, Mass., or the equivalent, using the catalyst full strength for 4 minutes, at room temperature (step 14). After removal from the catalyst, the piece is flush rinsed thoroughly, but not dried. It is then dipped into a solution of Accelerator 19, obtainable from Shipley Co., Wellesley, Mass., or the equivalent, made from 1 part accelerator to 3 parts water (step 15). The dip is for 2 minutes at room temperature, and the piece is flush rinsed, but not dried.

The work is then dipped into electroless copper mix solution 328, obtainable from Shipley Co., Wellesley, Mass., or the equivalent, mixed 1 part 328A and 1 part 328B to 8 parts distilled water at 85° F., agitated gently for 20–25 minutes, and flow rinsed in running water, but not dried (step 16). The piece is then dipped into a 20% fluoboric acid solution or the equivalent for 30 seconds (step 17), and transferred directly into the plating path. Fluoboric acid (reagent grade) is obtainable from J. T. Baker Chemical, Phillipsburg, Pa.

Figure 1C:
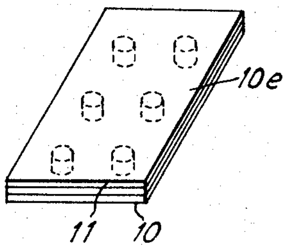

The piece is then electroplated in a bath of cupric fluoborate or the equivalent, obtainable from Allied Chemical, New York (step 18). The bath is operated as follows: Temperature 110° F., pH .4 to .5, 50% concentrate and 50% water mixture; started with a current density of .1 amp./in.$^2$, and gradually increased to 1 amp./in.$^2$, and plated to a thickness of 0.0015″ of copper. Time required is approximately 12 minutes. After plating, the piece is spray rinsed and dried with compressed air, and appears as in FIG. 1*c*, the electroplated cover layer being shown as **10*e***.

Figure 1D:
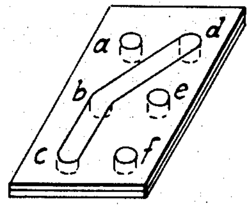

The work is now ready for the formation of another circuit layer. The upper surface is coated with resist, exposed through the second circuit negative film mask, exposed, the image developed, the unexposed resist removed, and the layer 10*e* etched in cupric chloride etchant as before (step 20). The piece then has the appearance shown in FIG. 1*d*, with a layer of copper connecting lands *c*, *b* and *d*. Because of the lesser thickness of layer 10*e*, a shorter etch time is sufficient; in this case, about 4 minutes. After etching, the new conductor layer is flushed with water, and the exposed resist removed as before, and the new layer dipped in "Ebonol" as with the first layer (step 21).

Figure 1E:
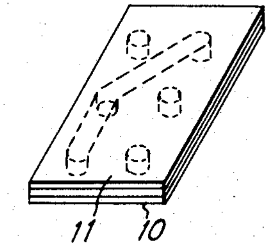

One or more layers of epoxy glass 112V–E730 are then bonded to the upper surface, using one layer of epoxy glass for every .004″ thickness desired, employing the steps previously described for laminating. The piece now appears as in FIG. 1*e*.

Figure 1F:
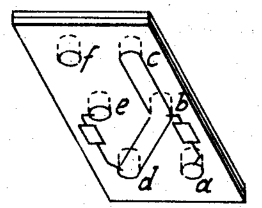
Figure 1G:
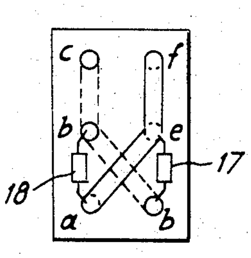

The lower surface of partly etched copper sheet 10 is now ready for the formation of the lowest circuit layer. The piece is dipped into cupric chloride etchant to remove the oxide, then scrubbed clean (step 23) as in step 2. The cleaned bottom surface (turned over as in FIG. 1*f*) is then coated with light-sensitive resist, exposed through a negative film mask for the lower surface circuit, the image developed, unexposed resist removed (step 24) as in setps 4, 5 and 6, and the lower surface etched (step 25) as in step 7. The exposed resist is then removed (step 26) and the board is ready for assembly (attachment of other desired circuit components).

Figure 2:
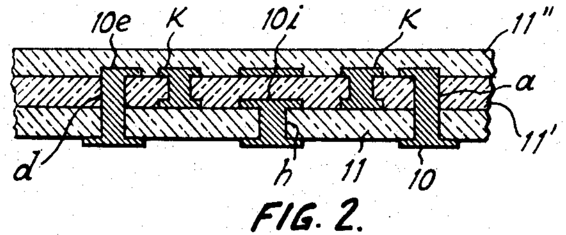
FIG. 2 is a fragmentary section through a completed printed circuit of my invention, somewhat enlarged for clarity.

The embodiment of my invention herein described with reference to FIG. 4 is a multilayer printed circuit having three circuit layers, bottom, top, and inner as shown in FIG. 2, but a two-layer board may be made as FIGS. 1*a*–1*g*, or more than three circuit layers may be provided if desired by following the principles explained.

Referring more particularly to FIG. 2 in which a three-layer board is shown, 10 designates the bottom layer of conductor having a circuit on its bottom surface and its upper surface having the upwardly projecting lands *a* and *d* which are molecularly united with the top circuit 10*e*, and by the lands *g* and *h* with the inner circuit 10*i*. 11 designates a layer of epoxy glass separating lower layer 10 from inner layer 10*i* and 11′ is another layer of epoxy glass separating inner circuit 10*i* from top circuit 10*e*, except where molecularly united to the top circuit by lands *k*.

If desired, the circuit board herein described may be bonded to a metal carrier which may be aluminum, anodized if desired, to protect against corrosion, copper, stainless steel, etc., or plastic such as epoxy glass. The bond to the carrier may be epoxy resins reinforced with glass or other fibers.

The term "molecularly united," as used herein, means a junction between different layers of circuits achieved by depositing a metallic conductor or another metallic conductor of the same or similar metal to form a unitary conducting path between said layers so that the junction is electrically and mechanically indistinguishable. The term does not include eyelet or solder connections, or connections by contacts, lead wires, or the like, nor does it include mechanical fastening, such as by cementing or the surface of which is plated.

The term "plated on " means the chemical and/or electrochemical deposition of a conductor, but does not include mecahnical fastening, such as by cementing or the like.

The term "multilayer" means more than one layer, including two, three, or more.

In the foregoing, I have described certain preferred forms and methods of practicing my invention, and the best mode presently contemplated by me for carrying it out, but it will be understood that modifications and changes may be made without departing from the spirit and scope thereof.

I claim:

1. The process of producing a printed circuit which comprises the steps of starting with a sheet of metallic conductor of sufficient thickness to be capable of self-support, photographically producing on said sheet an image of lands desired, partly etching away undesired conductor leaving projecting lands, applying to the etched surface a layer of insulating material, removing a portion of said insulating material down to the level of said lands so as to expose said lands, plating on a layer of conductor over and in contact with said lands and insulating material, photographically producing on said layer an image of a first circuit, etching away undesired conductor from said last mentioned layer forming a circuit pattern interconnected with said lands, and etching the previously unetched side of said sheet to form another circuit interconnected at selected points with said first circuit.

2. The process claimed in claim 1 which includes the step of heat and pressure bonding said layer of insulating material to the partly etched surface of said sheet.

3. The process of forming a multilayer printed circuit which comprises the steps of starting with a sheet of metallic conductor of sufficient thickness to be capable of self support, photographically producing on said sheet an image of the circuit desired, etching away undesired conductor leaving projecting lands, applying to the etched surface a layer of insulating material down to the level of said lands so as to expose said lands, plating on a layer of conductor over and in contact with said lands and insulating material, photographically producing on said layer an image of a second circuit, etching away undesired conductor from said last mentioned layer forming a circuit pattern interconnected with said lands, photographically producing on the unetched surface of said sheet an image of another circuit desired, and etching away undesired conductor to form the last-mentioned circuit interconnected at selected points with said second circuit.

4. In the process of producing a printed circuit by etching away undesired conductor to form the desired circuit, the steps of etching one side of a sheet of metallic conductor to form lands, heat and pressure bonding a layer of insulation to the etched side of said sheet, exposing said lands by removing insulation down to the level of said lands, depositing a layer of conductor over and in contact with said lands and insulation, etching said layer to form a circuit interconnected with said lands, and etching the previously unetched side of said sheet to form another circuit interconnected at selected points with said first circuit.

5. In the process of producing a printed circuit by etching away undesired conductor to form the desired circuit, the steps of etching one side of a sheet metallic conductor to form lands, bonding by adhesive a layer of insulation to the etched side of said sheet, exposing said lands by removing insulation down to the level of said lands, depositing a layer of conductor over and in contact with said lands and insulation, etching said layer to form a circuit interconnected with said lands, and etching the previously unetched side of said sheet to form another circuit interconnected at selected points with said first circuit.

6. In the process of producing a printed circuit by etching away undesired conductor to form the desired circuit as in claim 4, further including the steps of treating the etched metallic conductor with an abrasive to produce a roughened surface prior to bonding the layer of insulation, activating the metallic conductor in HCl after removing the insulation down to the level of said lands, treating the lamination with a catalyst, and treating the lamination with an accelerator.

7. In the process of producing a printed circuit by etching away undesired conductor to form the desired circuit as in claim 4, further including the steps of treating the etched metallic conductor with an etching solution to form a roughened surface prior to bonding the layer of insulation activating the metallic conductor in HCl after removing the insulation down to the level of said lands, treating the lamination with a catalyst, and treating the lamination with an accelerator.

References Cited

UNITED STATES PATENTS

| | | | |
|---|---|---|---|
| 2,695,351 | 11/1954 | Beck. | |
| 2,944,917 | 7/1960 | Cahne. | |
| 2,989,433 | 6/1961 | Lung Yuan. | |
| 3,006,819 | 10/1961 | Wilson et al. | |
| 3,011,920 | 12/1961 | Shipley. | |
| 3,194,681 | 7/1965 | Nicholson et al. | |
| 3,217,089 | 11/1965 | Beck. | |
| 1,963,834 | 6/1934 | Decker. | |
| 2,848,359 | 8/1958 | Talmey. | |
| 2,961,351 | 11/1960 | Ludwig. | |
| 3,060,076 | 10/1962 | Robinson. | |
| 3,102,213 | 8/1963 | Bedson et al. | 292—155.5 |
| 3,138,503 | 6/1964 | Taraud. | |
| 3,042,740 | 7/1962 | Bosworth | 174—68.5 |
| 3,053,929 | 9/1962 | Friedman | 174—68.5 |
| 2,447,541 | 8/1948 | Sabee et al. | 156—150 |
| 3,010,863 | 11/1961 | Coe et al. | 156—3 |

OTHER REFERENCES

I.B.M. Technical Disclosure Bulletin, vol. 1, No. 2, 8/1958, p. 25 relied on. Copy in 161—Prtd Cir. Dig.

ROBERT F. BURNETT, *Primary Examiner.*

ALEXANDER WYMAN, *Examiner.*

W. A. POWELL, *Assistant Examiner.*